United States Patent
Fitzgerald et al.

(10) Patent No.: US 12,389,718 B2
(45) Date of Patent: Aug. 12, 2025

(54) METHOD FOR FABRICATING A SEMICONDUCTOR DEVICE INCLUDING INTEGRATING III-V DEVICE AND CMOS DEVICE, AND THE SEMICONDUCTOR DEVICE THEREOF

(71) Applicant: NEW SILICON CORPORATION PTE LTD, Singapore (SG)

(72) Inventors: Eugene A. Fitzgerald, Windham, NH (US); Kenneth Eng Kian Lee, Singapore (SG); Cheng Yeow Ng, Singapore (SG); Fayyaz Moiz Singaporewala, Singapore (SG)

(73) Assignee: NEW SILICON CORPORATION PTE LTD, Singapore (SG)

( * ) Notice: Subject to any disclaimer, the term of this patent is extended or adjusted under 35 U.S.C. 154(b) by 621 days.

(21) Appl. No.: 17/640,547

(22) PCT Filed: Sep. 25, 2020

(86) PCT No.: PCT/SG2020/050544
§ 371 (c)(1),
(2) Date: Mar. 4, 2022

(87) PCT Pub. No.: WO2021/061052
PCT Pub. Date: Apr. 1, 2021

(65) Prior Publication Data
US 2022/0293820 A1   Sep. 15, 2022

Related U.S. Application Data

(60) Provisional application No. 62/906,986, filed on Sep. 27, 2019.

(51) Int. Cl.
*H10H 20/824* (2025.01)
*H01L 25/16* (2023.01)
*H10H 20/833* (2025.01)

(52) U.S. Cl.
CPC ......... *H10H 20/824* (2025.01); *H01L 25/167* (2013.01); *H10H 20/833* (2025.01)

(58) Field of Classification Search
CPC ..... H01L 33/30; H01L 33/42; H10H 20/0133; H10H 20/018; H10H 20/824; H10H 20/833; H10H 20/857; H10D 84/08
(Continued)

(56) References Cited

U.S. PATENT DOCUMENTS

| 5,376,580 A | 12/1994 | Kish et al. |
| 7,535,089 B2 | 5/2009 | Fitzgerald |

(Continued)

FOREIGN PATENT DOCUMENTS

| CN | 109346497 | 2/2019 |
| CN | 109346497 A | 2/2019 |

(Continued)

OTHER PUBLICATIONS

Intellectual Property Office of Singapore, International Search Report and Written Opinion for PCT/SG2020/050544, Dec. 21, 2020.
(Continued)

*Primary Examiner* — Matthew E. Gordon
(74) *Attorney, Agent, or Firm* — Williams Mullen; F. Michael Sajovec

(57) ABSTRACT

A method of fabricating a semiconductor device (200) is described. According to a described embodiment, the method comprises: (i) forming a III-V semiconductor material layer (206) comprising a substrate layer (208) and a device layer (210) attached to the substrate layer (208); and (ii) forming an electrically conductive interlayer (228) to the device layer (210) prior to bonding the electrically conductive interlayer (228) to a partially processed CMOS device layer (204) having at least one transistor (205).

12 Claims, 8 Drawing Sheets

(58) Field of Classification Search
USPC .......................................................... 257/103
See application file for complete search history.

(56) References Cited

U.S. PATENT DOCUMENTS

| | | | |
|---|---|---|---|
| 7,705,370 | B2 | 4/2010 | Fitzgerald |
| 8,012,592 | B2 | 9/2011 | Fitzgerald |
| 8,120,060 | B2 | 2/2012 | Fitzgerald |
| 9,530,763 | B2 | 12/2016 | Fitzgerald |
| 10,049,947 | B2 | 8/2018 | Lee et al. |
| 10,134,945 | B1 * | 11/2018 | Liu ................. H01L 21/185 |
| 10,325,894 | B1 * | 6/2019 | Pan ................. H01L 25/167 |
| 2016/0327737 | A1 | 11/2016 | Zhang et al. |
| 2017/0317050 | A1 | 11/2017 | Dayeh et al. |
| 2017/0358562 | A1 | 12/2017 | Banna et al. |
| 2019/0189603 | A1 * | 6/2019 | Wang ................. H01L 23/481 |

FOREIGN PATENT DOCUMENTS

| | | |
|---|---|---|
| JP | 2007-096160 | 4/2007 |
| JP | 2020-529729 | 10/2020 |
| WO | 2018053378 | 3/2018 |
| WO | PCT/US2017/051948 | 3/2018 |
| WO | 2019027820 | 2/2019 |

OTHER PUBLICATIONS

Intellectual Property Office, Examination Report for International Patent Application No. GB2203190.0, Jul. 18, 2023.
Japanese Patent Office, Japanese Office Action, International Patent Application No. JP 2022-517825, Jul. 6, 2024.
Korean Intellectual Property Office (KIPO), Examination Report for International Patent Application No. KR 10-2022-7009257, Nov. 14, 2024.

* cited by examiner

METHOD FOR FABRICATING A SEMICONDUCTOR DEVICE INCLUDING INTEGRATING III-V DEVICE AND CMOS DEVICE, AND THE SEMICONDUCTOR DEVICE THEREOF

CROSS-REFERENCE TO RELATED APPLICATIONS

This application is a U.S. National Stage of International Application No. PCT/SG2020/050544 filed on Sep. 25, 2020, which claims priority to U.S. Application No. 62/906,986, filed on Sep. 27, 2019, the disclosures of which are incorporated herein by reference as if set forth in their entireties.

TECHNICAL FIELD

The present disclosure relates to a method for fabricating a semiconductor device and also the semiconductor device.

BACKGROUND

Numerous methods have been used to integrate Complementary Metal Oxide Semiconductor (CMOS) integrated circuits with other specialized integrated circuits such as those which include III-V devices. Most of these methods merge the integrated circuits at a package-level which involve a parallel integrated process flow by which the III-V devices are processed in parallel on separate wafers from CMOS devices, and are subsequently merged and interconnected at the chip or wafer-level after device fabrication. A more desirable approach is to integrate these integrated circuits monolithically, which potentially reduces packaging size and costs. In contrast to the package-level integration method, monolithic integration processes involve a serial sequence where all devices are fabricated in various sequential steps on a wafer flow and then interconnected all at once using a back-end process, for example, a back-end silicon CMOS process.

Various monolithic processes to integrate III-V materials with CMOS involve III-V devices that can emit or detect visible light. An example of such a monolithic process is shown in FIG. 1. FIG. 1 shows a side-by-side configuration 100 of a top CMOS "front-end" transistor layer 102 and a multi-layer III-V optoelectronic device 104 used in an existing art. Note that the "back-end" of a CMOS chip (e.g. interconnect layers and dielectrics connecting CMOS transistors of the CMOS transistor layer 102 to the III-V optoelectronic device 104 and other CMOS transistors) is not shown for simplicity. In this side-by-side configuration 100, the silicon CMOS transistor layer 102 and the III-V device 104 cannot occupy a same area from a plan-view wafer perspective (i.e. when viewing from a top side of the wafer). This side-by-side configuration 100 of FIG. 1 is typically used because the III-V device 104 is processed when a top silicon layer (not shown) originally on top of the buried III-V epitaxial stacks 106 is removed. Once the top silicon layer above the buried III-V epitaxial stacks 106 is removed (e.g. by etching), the buried III-V device layers 106 can be processed with standard top-down process steps such as etching and deposition to form the III-V device 104. It is clear that these process steps cannot proceed when the buried III-V device layers 106 are covered initially with the top silicon layer being in place. As shown in FIG. 1, this process also leaves buried III-V device layers 108 underneath the top CMOS "front end" transistor layer 102 unprocessed. Further, the III-V device 104 is required to operate from a top-side (i.e. an opposite side to a silicon substrate 110) to avoid absorption of visible light by the silicon substrate 110 since an efficient emission area 112 of the III-V device 104 may not exist underneath a top silicon layer. Thus, there is a device density limit for the monolithic process configuration 100 of FIG. 1.

Besides having the device density limit, the required topside emission or detection of the optoelectronic III-V device 104 means that such III-V optoelectronic device 104 being introduced in this side-by-side configuration as shown in FIG. 1 would have more restricted design requirements. For example, in an embodiment where the III-V device 104 is a III-V light emitting diode (LED), it is necessary to design the epitaxial layer stack 106 defining the LED structure and the contact metallization 114 on top of the LED to allow as much light 116 to be directed upwards as possible. As shown in FIG. 1, for example, the contact metallization 114 to the LED is required to have an opening in it, i.e. a window in the electrical contact, in order to allow transmission of light 116 out of the LED. The window in the contact metallization 114 is exemplified by a top-view 117 of an annular shape of the contact 114 as shown in FIG. 1. This necessity introduces a trade-off between efficient current injection across an entire LED and how much light 116 can be transmitted from a top-side of the LED. In addition, the back-end interconnects in the silicon integrated circuit (not shown) have to be routed around the LED emission area 112 so that these interconnects do not block the emitted light 116.

The significance of the current injection versus light emission trade-off at the top-side of the LED described above largely depends on an ability of the current to spread sideways in the top $p^+$ semiconductor layer 118 of the III-V device layers 106. In an embodiment where the III-V device is a GaN LED, the top $p^+$ GaN layer is typically doped with magnesium (Mg) and has a high lateral resistance when compared to $n^+$ GaN or a metal. Thus, in this case, there is considerable penalty for eliminating some metallization at the top-side for the GaN LED. Therefore, the side-by-side configuration 100 of the prior art creates both LED inefficiency as well as a reduced, sub-optimal, device density. It is therefore desirable to provide a method for fabricating a semiconductor device and a semiconductor device which address the aforementioned problems and/or provides a useful alternative.

Furthermore, other desirable features and characteristics will become apparent from the subsequent detailed description and the appended claims, taken in conjunction with the accompanying drawings and this background of the disclosure.

SUMMARY

Aspects of the present application relate to a method for fabricating a semiconductor device and also the semiconductor device, in particular, a semiconductor device which includes an electrically conductive interlayer formed between a CMOS device layer and a III-V device layer.

In accordance with a first aspect, there is provided a method of fabricating a semiconductor device, comprising: (i) forming a III-V semiconductor material layer comprising a substrate layer and a device layer attached to the substrate layer; and (ii) forming an electrically conductive interlayer to the device layer prior to bonding the electrically conductive interlayer to a partially processed CMOS device layer having at least one transistor.

By forming the electrically conductive interlayer to the device layer prior to bonding the electrically conductive interlayer to the partially processed CMOS device layer, a contact resistance of a III-V device included in the device layer of the III-V semiconductor material layer is reduced. Further, with the formation of the electrically conductive interlayer, the III-V device included in the III-V device layer can be located below (or covered by) the partially processed CMOS layer due to the high lateral conductivity of the electrically conductive interlayer. This leads to an increase in a device density of the semiconductor device integrating CMOS and III-V devices. Particularly, the ultimate density of a III-V+CMOS device circuit has a limit defined by an area occupied by the silicon CMOS and an area occupied by the interconnects required for connecting the CMOS devices to the III-V devices. This assumes that negligible space is consumed by the III-V device. With respect to the prior art side-by-side configuration 100 as shown in FIG. 1, the assumption of negligible space consumed by the III-V device does not hold true. In contrast, as discussed above, the present method enables the III-V device included in the III-V device layer to be located below the partially processed CMOS layer, so that an effective area for the III-V+CMOS circuit includes only the silicon CMOS area and the area for the interconnects in order to achieve the ultimate density for a III-V+CMOS device circuit.

Further, with an increased device density, lower integrated circuit cost can be achieved. This is because a higher device density will enable more chips to be fabricated per wafer, thereby lowering a fabrication cost of each integrated circuit. In addition, formation of the electrically conductive interlayer provides a higher degree of freedom for designing a layout of the back-end interconnects, since the III-V device included in the III-V device layer can be located below the partially processed CMOS layer. Details on the layout and how at least some of these advantages are achieved are discussed below in relation to FIG. 2.

The method may comprise bonding the electrically conductive interlayer to the partially processed CMOS device layer.

Forming the III-V semiconductor material layer may include epitaxially depositing the device layer on the substrate layer.

The device layer may include an optoelectronic device having a top device surface, a bottom device surface and an active optical area between the top device and bottom device surfaces; the bottom device surface being attached to the substrate layer and passage of light is via the bottom device surface.

The substrate layer may include a light transmissible substrate.

The method may comprise removing the substrate layer after the CMOS device layer is bonded to the electrically conductive interlayer.

The method may comprise bonding a light transmissible substrate to the bottom device surface of the optoelectronic device after removal of the substrate layer. With the removal of the substrate layer, the light transmissible substrate serves to provide structural support for the semiconductor device and allow light to pass through via the bottom device surface.

The method may comprise forming vias and metal lines to electrically connect the at least one transistor of the CMOS device layer to the optoelectronic device.

The method may comprise depositing a bonding material to the electrically conductive interlayer prior to bonding the CMOS device layer to the electrically conductive interlayer, and the method may comprise chemo-mechanically polishing the bonding material. Depositing a bonding material and chemo-mechanically polishing the bonding material advantageously improves an adhesion between the CMOS device layer and the electrically conductive interlayer when the CMOS device layer is bonded to the electrically conductive interlayer.

The electrically conductive interlayer may include indium tin oxide.

In accordance with a second aspect, there is provided a semiconductor device, the semiconductor device comprising: a partially processed CMOS device layer having at least one transistor; a III-V semiconductor material layer comprising a substrate layer and a device layer attached to the substrate layer; and an electrically conductive interlayer attached to and sandwiched between the partially processed CMOS device layer and the device layer.

The device layer may include an optoelectronic device having a top device surface, a bottom device surface, and an active optical area between the top device and bottom device surfaces, the bottom device surface being attached to the substrate layer and passage of light is via the bottom device surface.

The substrate layer may include a light transmissible substrate. The light transmissible substrate serves to provide structural support for the semiconductor device and allow light to pass through via the bottom device surface.

It should be appreciated that features relating to one aspect may be applicable to the other aspects. Embodiments therefore provide a method of fabricating a semiconductor device comprising forming the electrically conductive interlayer to the device layer of the III-V semiconductor material layer prior to bonding the electrically conductive interlayer to the partially processed CMOS device layer. This advantageously achieves a lower contact resistance for the III-V device included in the device layer of the III-V semiconductor material layer. With the formation of the electrically conductive interlayer, the III-V device included in the III-V device layer can be located below the partially processed CMOS layer due to the high lateral conductivity (e.g. less than 100 Ohm/sq) of the electrically conductive interlayer. This leads to an increase in a device density of the semiconductor device integrating CMOS and III-V devices. In addition, with an increased device density, lower integrated circuit cost can be achieved. Further, the formation of the electrically conductive interlayer provides a higher degree of freedom for designing a layout of the back-end interconnects, since the III-V device included in the III-V device layer can be located below the partially processed CMOS layer.

BRIEF DESCRIPTION OF THE DRAWINGS

Embodiments will now be described, by way of example only, with reference to the following drawings, in which.

DETAILED DESCRIPTION

Exemplary embodiments relate to a method for fabricating a semiconductor device and also the semiconductor device, in particular, a semiconductor device which includes an electrically conductive interlayer formed between a CMOS device layer and a III-V device layer.

Figure 2:
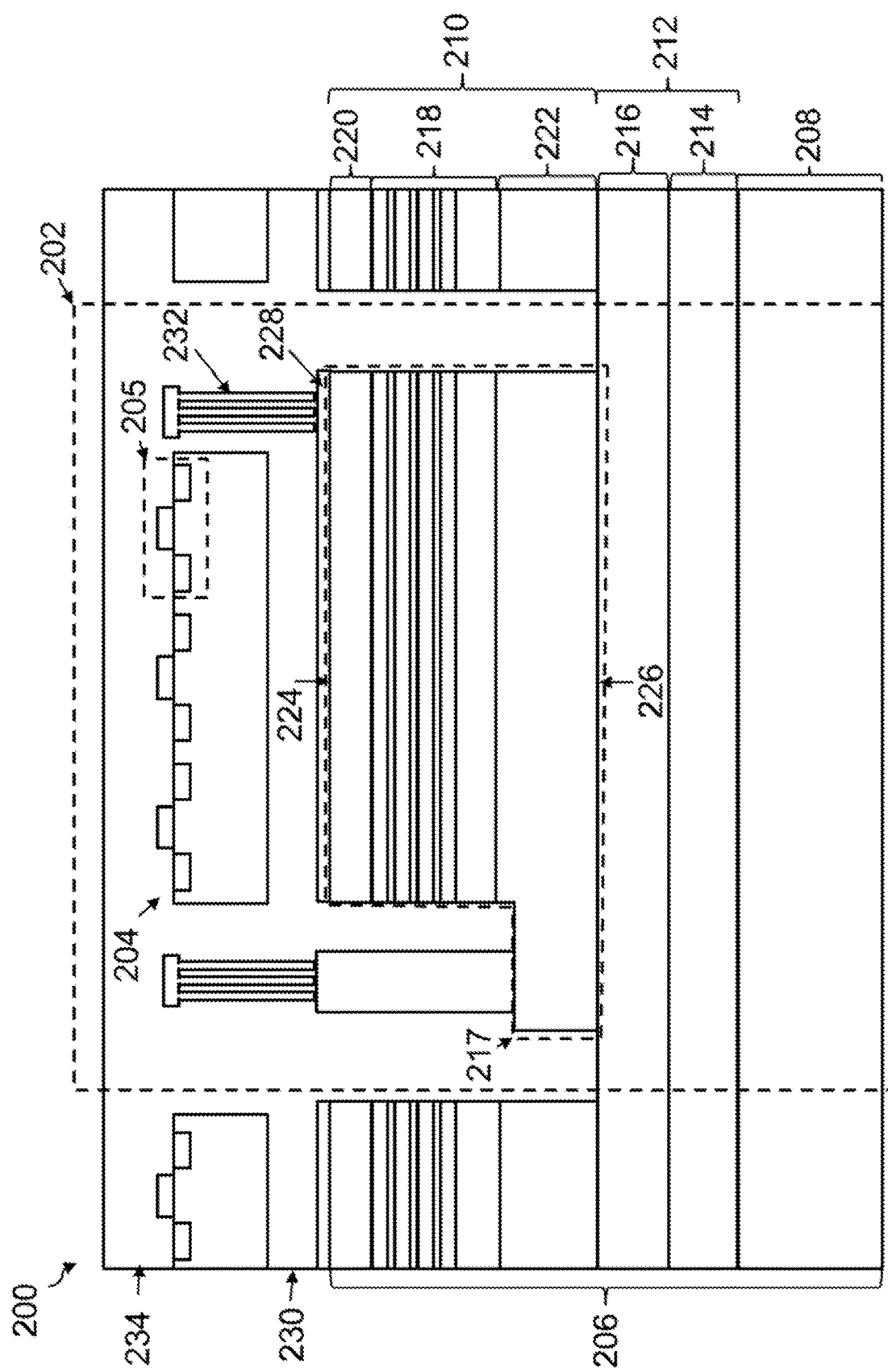
FIG. 2 shows a schematic structure of a semiconductor device integrating CMOS and III-V devices in accordance with a first embodiment, where an electrically conductive interlayer is formed between a partially processed CMOS device layer and a device layer of the III-V semiconductor material layer.

FIG. 2 shows a schematic structure 200 of a semiconductor device 202 integrating CMOS and III-V devices in accordance with a first embodiment. Depending on a specific type and/or application of the III-V device which is integrated in the semiconductor device, variations of a structure of the semiconductor device 202 exist and these are discussed in relation to FIGS. 3 and 4. In all the FIGS. 2 to 4, back end metallization is not shown for clarity.

The semiconductor device 202 comprises a partially processed CMOS device layer 204 having at least one transistor 205 and a III-V semiconductor material layer 206. In the present embodiment, the partially processed CMOS device layer 204 includes silicon CMOS front-end transistors formed on a Si (100) substrate, and have a thickness of about 1000 nm, although other types of CMOS devices may be included in the partially processed CMOS device layer 204 of a different thickness. The III-V semiconductor material layer 206 comprises a substrate layer 208 and a device layer 210 attached to the substrate layer 208. In an embodiment, the device layer is epitaxially deposited on the substrate layer 208, for example by molecular beam epitaxy (MBE) or metal organic chemical vapor deposition (MOCVD) techniques. The substrate layer 208 comprises a silicon (Si) (111) substrate in the present embodiment, although other CMOS-compatible substrate may be used. The Si (111) substrate is about 725 μm thick. In the present embodiment as shown in FIG. 2, the semiconductor device 202 also includes, optionally, a buffer layer 212 sandwiched between the substrate layer 208 and the device layer 210. The buffer layer 212 serves to reduce propagation of defects generated, for example, as a result of lattice mismatch between the substrate layer 208 and the device layer 210. The buffer layer 212 is commonly used in III-V-on-silicon substrate, for example a GaN-based device layer on a silicon substrate, due to the difference in their crystal lattice constants. For example, in a GaN-on-silicon substrate, the buffer layer 212 may include sub-buffer layers 214, 216 such as a graded AlGaN buffer layer 214 and an undoped GaN buffer 216. In another example, for a GaAs-on-silicon substrate, a Ge/GaAs buffer layer 212 may be used. In other embodiments, a buffer layer 212 is not required and so the substrate layer 208 may be directly attached to the device layer 210.

The device layer 210 includes a III-V device 217. The III-V device 217 may be an electronic device or an optoelectronic device. A III-V electronic device and a III-V optoelectronic device may share a similar device structure, except that the III-V optoelectronic device which involves receiving and transmitting light will require at least a partially unblocked active optical area for emitting and/or receiving light. In the present embodiment as shown in FIG. 2, the III-V device 217 comprises an active layer 218 formed between a top device electrode layer 220 and a bottom device electrode layer 222. As shown in FIG. 2, the active layer 218 includes multiple material layers, for example, an active electronic layer for an electronic device (e.g. a heterojunction bipolar transistor (HBT) or a high electron mobility transistor (HEMT)) or an active optoelectronic layer for an optoelectronic device (e.g. a light emitting diode or a laser). In an embodiment where the III-V device is a GaAs HBT, the top device electrode layer 220 and the bottom device electrode layer 222 may each includes an n-doped GaAs layer. The top device electrode layer 220 therefore forms a top device surface 224 and the bottom device electrode layer 222 forms a bottom device surface 226. As shown in FIG. 2, the top device surface 224 and the bottom device surface 226 of the present embodiment are planar surfaces. In the present embodiment where the substrate layer 208 includes the Si (111) substrate which is not optically transparent, the III-V device 217 includes an electronic device which does not require receiving and/or emitting light. However, as would be appreciated by a skilled person in the art, even if the substrate layer 208 includes the Si (111) substrate, and that the III-V device is fully under the CMOS device layer 204, the fact that the interconnects (e.g. tungsten plugs/pads 232) are not blocked by the CMOS device layer 204 means that there may be gaps between the CMOS device layer 204 and the interconnects. Therefore, even in this case, light can scatter out of these gaps. Thus, it is possible that in some embodiments, even if the substrate layer 208 includes the Si (111) substrate, the III-V device 217 may include an optoelectronic device. While light emission in these embodiments is poorer, it may still be sufficient for certain applications (e.g. where the light is used as an indicator, or for low-level illumination). In another embodiment, the substrate layer 208 of the III-V semiconductor material layer 206 includes a light transmissible or optically transparent substrate. In this embodiment, the III-V device 217 may include an optoelectronic device since light can be emitted or received through the light transmissible or optically transparent substrate at the bottom side of the III-V device 217. Embodiments where the III-V device layer 210 comprises a III-V optoelectronic device, such as a LED, are discussed in relation to FIGS. 3 and 4 below.

As shown in FIG. 2, an electrically conductive interlayer 228 is attached to the device layer 210 and is sandwiched between the partially processed CMOS device layer 204 and the device layer 210. This electrically conductive interlayer 228 is applied across the device layer 210 before the front-end CMOS layer 204 is transferred onto the III-V semiconductor material layer 206 since it is not possible to form the electrically conductive interlayer 228 laterally once the front-end CMOS layer 204 is in place, given that there is no process-access to the III-V device layer 210 for the rest of the fabrication process at any regions where the front-end CMOS layer 204 remains. Although the electrically conductive interlayer 228 is shown in FIG. 2 as a single layer, the electrically conductive interlayer 228 may also comprise a plurality of conductive layers. The electrically conductive interlayer 228 may comprise a metal or a conductive oxide such as indium tin oxide (ITO), or a combination of the two.

In the present embodiment, a bonding material 230 such as silicon dioxide ($SiO_2$) is deposited on the electrically conductive interlayer 228 before the partially processed CMOS device layer 204 is bonded to the electrically conductive interlayer 228. The bonding material 230 may be chemo-mechanically polished before the partially processed CMOS device layer 204 is bonded to the electrically conductive interlayer 228. The bonding material 230 may have a thickness of about 500 nm.

Once the partially processed CMOS device layer 204 is bonded to the III-V semiconductor material layer 206 as shown in FIG. 2, a conductive plug 232 (e.g. tungsten plugs) can be formed on each of the top and bottom device electrode layers 220, 222 for electrically contacting the III-V device 217. A top surface of these conductive plugs 232 are approximately co-planar with the silicon CMOS front-end transistors of the partially processed CMOS device layer 204 as shown in FIG. 2. The integrated semiconductor device 202 can then be encapsulated by another insulating material 234 (e.g. $SiO_2$). A typical thickness of this insulating material 234 formed above the CMOS device layer 204 is about 800 nm. Back-end silicon CMOS processes can be performed to interconnect the at least one transistor 205 of the CMOS device layer 204 with the III-V device 217 to form an integrated circuit. For example, vias and metal lines can be formed to electrically connect the at least one transistor 205 of the partially processed CMOS device layer 204 to the III-V device 217. This may include forming a further conductive plug (e.g. a metal plug) on either the at least one transistor 205, or on the conductive plug electrically contacting the device electrode layers 220, 222 of the III-V device 217.

As shown in FIG. 2, a substantial part of the III-V device layer 210 can be overlapped with the partially processed CMOS device layer 204. In other words, a higher device density can be achieved as compared to the side-by-side configuration previously shown in FIG. 1. This advantage is provided by the electrically conductive interlayer 228 formed between the partially processed CMOS device layer 204 and the III-V device layer 210, where a high lateral conductivity of the electrically conductive interlayer 228 enables conductive plugs 232 formed to contact a small area of the III-V device that extends beyond the edge of the CMOS device layer 204. The rest of the III-V device can then be located below the CMOS device layer 204.

Figure 3:
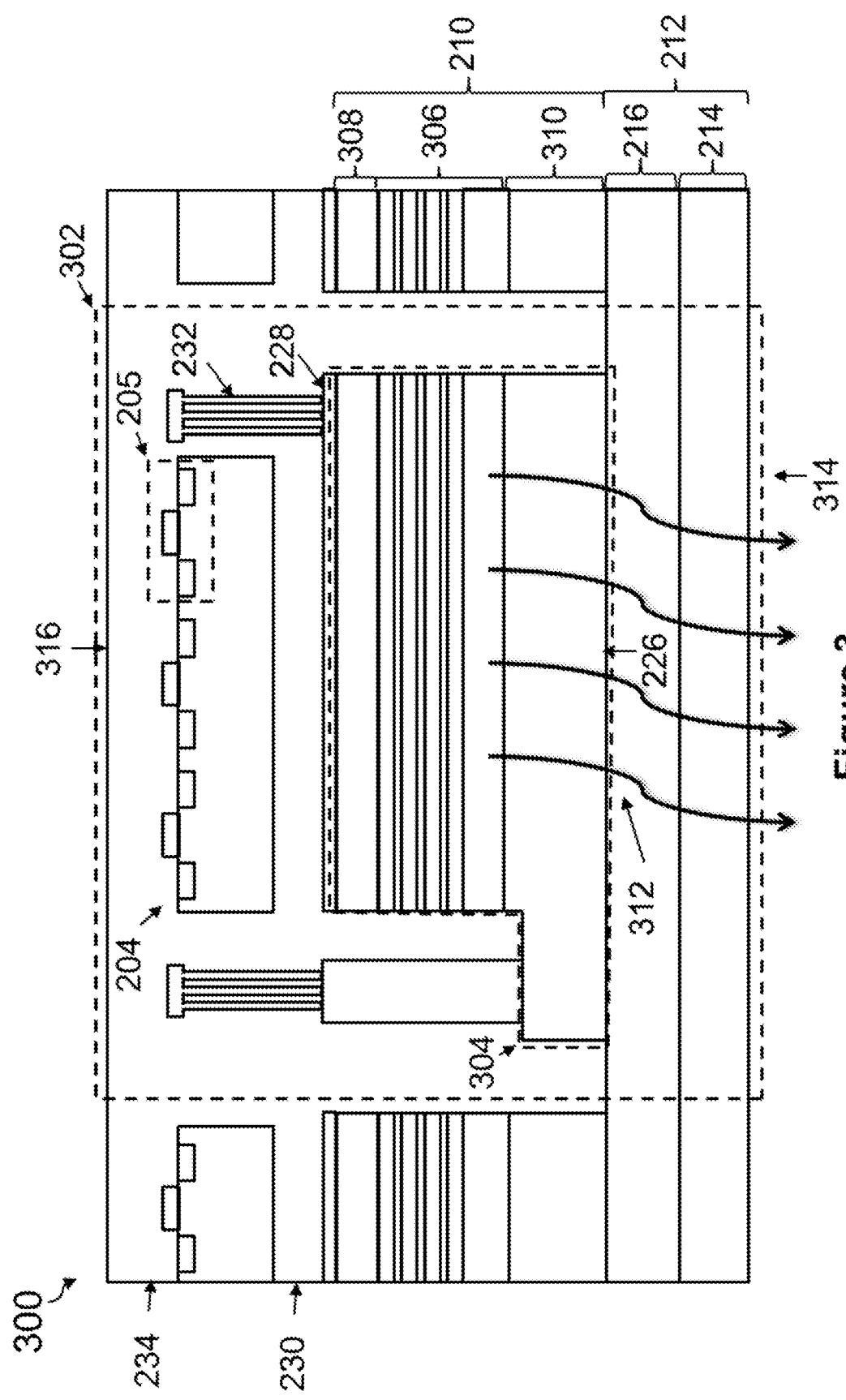
FIG. 3 shows a schematic structure of a semiconductor device integrating CMOS and III-V devices in accordance with a second embodiment, where the III-V device is a light-emitting diode (LED) and at least a substrate layer of the III-V semiconductor material layer has been removed to allow light to escape from a bottom-side of the semiconductor device.

FIG. 3 shows a schematic structure 300 of a semiconductor device 302 integrating CMOS and III-V devices in accordance with a second embodiment. Similar features are labelled with a same numerical reference. The second embodiment of the semiconductor device 302 as shown in FIG. 3 has a similar structure to that of the semiconductor device 202 as shown in FIG. 2, except for the removal of the substrate layer 208.

In the present embodiment, the III-V device 304 of the semiconductor device 302 is an optoelectronic device such as a light-emitting diode (LED). In this case, the active layer 306 of the III-V device 304 formed between the top device electrode layer 308 and the bottom device electrode layer 310 may include an active optical layer comprising a plurality of quantum wells for emitting light. An example of a plurality of quantum wells include multiple alternate layers of (Al)GaN and InGaN layers. In this embodiment, the top device electrode layer 308 includes a p-doped GaN layer such as a Mg-doped GaN layer and the bottom device electrode layer 310 includes a n-doped GaN layer such as a Si-doped GaN layer. The top device electrode layer 308 therefore forms a top device surface and the bottom device electrode layer 310 forms a bottom device surface, where the active optical layer 306 forms an active optical area for the semiconductor device. Although a GaN-based device is used in this embodiment, other III-V semiconductor devices may be used, for example, GaAs-based devices.

In the present embodiment, where the III-V device 304 is an optoelectronic device, the substrate layer 208 has been removed to allow light 312 to be transmitted from the III-V device 304 (e.g. from the active optical area of the III-V device 304) via the bottom device surface 226 from a bottom side 314 of the semiconductor device 302. In the present embodiment, a top surface 316 of the semiconductor device 302 wafer is bonded to a support wafer or a supporting structure (not shown) to provide mechanical support for the structure 300. The support wafer is bonded over a top of the back-end metallization/interconnects (not shown in FIG. 3) which are formed for electrically connecting the CMOS and III-V devices. In embodiments where chips are made from the structure 300, a wafer (e.g. 200 mm in diameter) comprising the structure 300 has to be diced up into individual chips (e.g. several mm×several mm). Because these individual chips are much smaller, the support wafer can be thinned down. Further, in embodiments where the chips are mounted onto a holder/PCB, then the rest of the support wafer may be fully removed.

Further, in the present embodiment where the III-V device 304 is an optoelectronic device such as a LED, a higher degree of freedom in designing a layout of the back-end interconnects (not shown in FIG. 3) is possible since the design of the layout of the back-end interconnects no longer requires to take into consideration issues associated with emission of light for the III-V device 304 (e.g. whether the back-end interconnects may block light emission from the III-V device 304). In addition, the entire bottom side 314 of the semiconductor device 302 can be used for transmission of light and therefore an effective optical area for the III-V device is increased.

Figure 4:
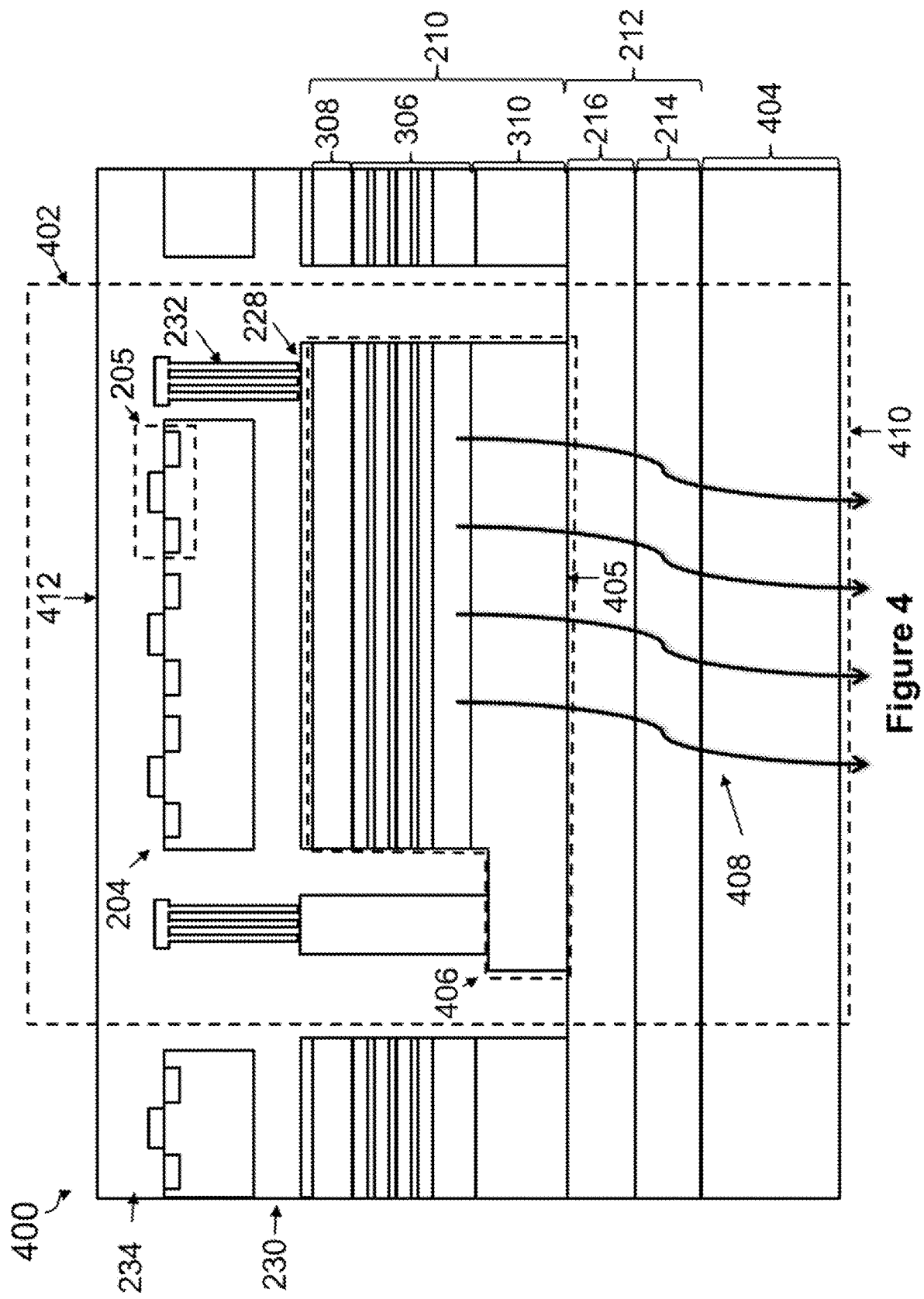
FIG. 4 shows a schematic structure of a semiconductor device integrating CMOS and III-V devices similar to that of FIG. 3 but with the substrate layer of the III-V semiconductor material layer being replaced by a light transmissible substrate instead of it being removed, in accordance with a third embodiment.

FIG. 4 shows a schematic structure 400 of a semiconductor device 402 integrating CMOS and III-V devices similar to FIG. 3, but with the substrate layer 208 being replaced by a light transmissible substrate 404 instead of it being removed, in accordance with a third embodiment. As shown in FIG. 4, the light transmissible substrate 404 is bonded to a bottom device surface 405 of the III-V device 406, via the buffer layer 212. In another embodiment where there is no buffer layer 212, the light transmissible substrate 404 is bonded directly to the bottom device surface 405. In either case, the light transmissible substrate 404 is considered to be bonded to the bottom device surface 405.

The light transmissible substrate 404 may include a glass substrate or any other type of optically transparent substrate. In this case, light 408 can be transmitted through the light transmissible substrate 404 at a bottom side 410 of the semiconductor device 402. In an embodiment where the III-V device 406 is a photodetector, light of any wavelength can directly impinge on the photodetector from the bottom side 410 since the substrate layer 208 of the embodiment of FIG. 2 has been removed. For the embodiment of FIG. 2 where the substrate layer 208 is a silicon substrate, removal of the silicon substrate means photons with energy higher than the silicon band gap energy (~1.1 eV) can be transmitted.

Further in an embodiment where the III-V device 406 is a diode capable of emitting and detecting light, an addition advantage of monolithic integration allows for CMOS circuitry of the CMOS device layer 204 to switch between implementing a driving current through the diode 406 and detecting a current inside the diode 406. Thus, a diode arrays can function both as detectors and emitters since the CMOS circuitry can be reconfigured for each mode.

Figure 1:
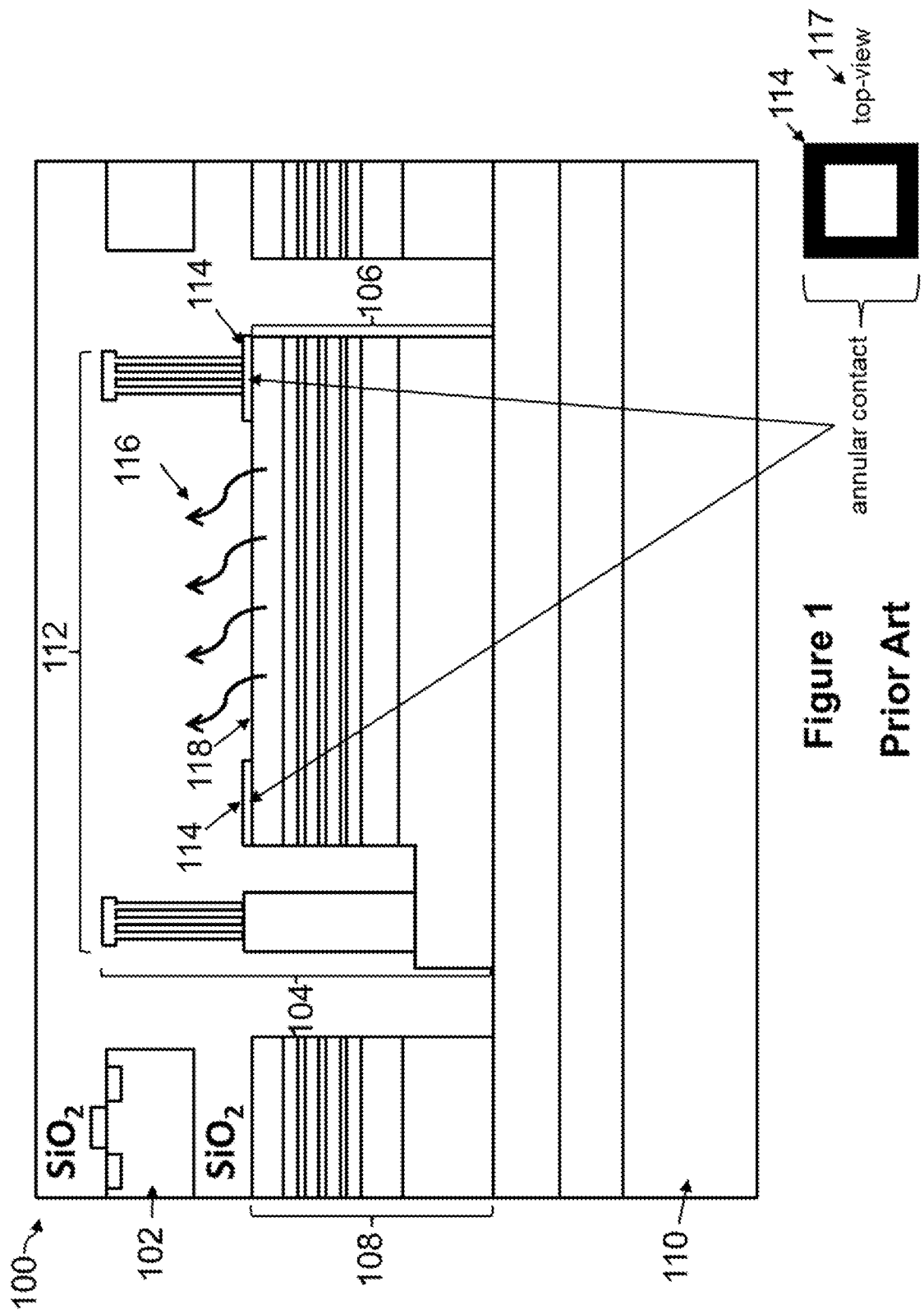
FIG. 1 shows a schematic structure of a side-by-side configuration for monolithic integration of III-V and CMOS devices according to a prior art.

The structure 400 as shown in FIG. 4 can be fabricated based on the structure 300 of FIG. 3. To be clear, as described in relation to FIG. 3, the structure 300 of FIG. 3 includes the support wafer (not shown) attached to the top surface 316 of the semiconductor device 302. The support wafer is attached to the top surface 316 to provide mechanical strength for the structure 300 prior to the removal of the substrate 208. In the present embodiment as shown in FIG. 4, a starting point for fabricating the structure 400 is therefore a presence of a support wafer attached to a top surface 412 of the structure 400 and an absence of the substrate 208 from the structure 400. As described above, the light transmissible substrate 404 is then bonded to the bottom device surface 405 of the III-V device 406 to form the structure 400 as shown in FIG. 4. Once the light transmissible substrate 404 is bonded to the bottom device surface 405, the support wafer previously attached to the top surface 412 may be removed or may be retained. Similar to the embodiment as shown in FIG. 3, the device density achievable for the present embodiment as shown in FIG. 4 is also higher than that achieved by the side-by-side configuration as shown in FIG. 1. Further, similar to the embodiment as shown in FIG. 3, the present embodiment of FIG. 4 shares similar advantages such as reducing contact resistances to the III-V device 406, and providing a larger effective optical active area through the bottom side 410 of the semiconductor device 402.

Although FIGS. 2, 3 and 4 only show two contacts (e.g. source and drain contacts) of the III-V device 217, 304, 406, it is appreciated that one or more additional contacts (e.g. a gate contact) may be formed for the III-V device 217, 304, 406.

Figure 5:
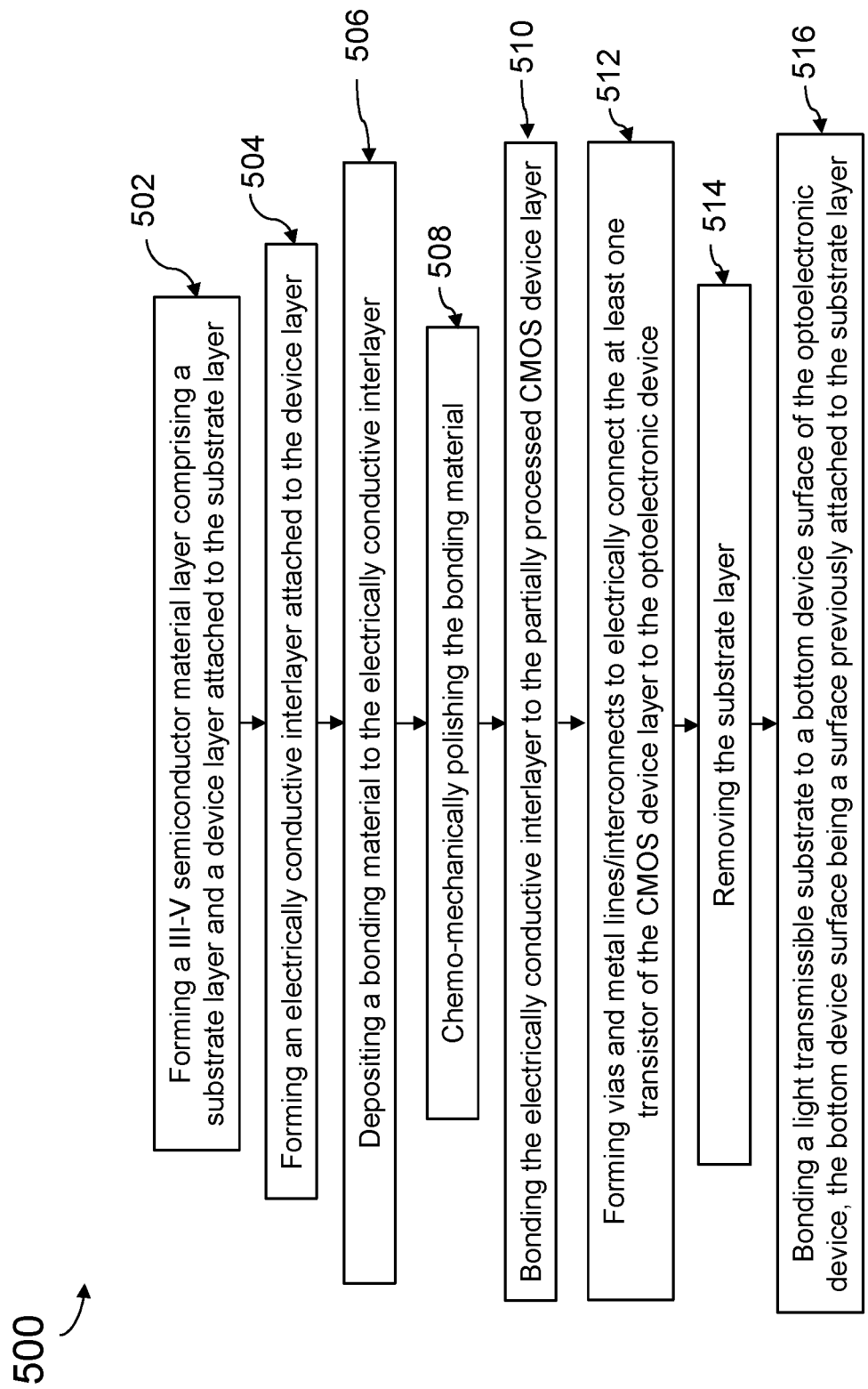
FIG. 5 is a flowchart showing steps of a method for fabricating the semiconductor devices of FIGS. 2 to 4 in accordance with an embodiment.

FIG. 5 is a flowchart showing steps of a method 500 for fabricating the semiconductor devices 202, 302, 402 of FIGS. 2 to 4, in accordance with an embodiment. In particular, all the semiconductor devices 202, 302, 402 share a similar process steps from a step 502 to a step 512. However, the fabrication of the semiconductor device 302 of FIG. 3 continues with a step 514, and the fabrication of the semiconductor device 402 of FIG. 4 continues with the step 514 and a step 516. The difference between these different embodiments will be made clear in the following description.

In the step 502, a III-V semiconductor material layer 206 comprising a substrate layer 208 and a device layer 210 attached to the substrate layer 208 is formed. Forming the III-V semiconductor material includes epitaxially depositing the device layer 210 on the substrate layer 208. The III-V device layer 210 formed is preferably of a high quality with a low particle and defect density. In the present embodiment, the substrate layer 208 comprises a silicon substrate and the III-V semiconductor device layer 210 is GaN-based, where the GaN-based device layer 210 is deposited on the silicon substrate 208 using a metal organic chemical vapor deposition (MOCVD) technique. The III-V semiconductor material layer 206 can therefore be considered as a III-V semiconductor-on-Si substrate in the present embodiment. As discussed in relation to FIGS. 2 to 4, the device layer 210 includes an active layer 218, 306 which may either form an electrically active layer or an optically active layer of the III-V device 217, 304, 406. Separately, a CMOS-compatible wafer is sent through a front-end CMOS process. The CMOS-compatible wafer in the present embodiment comprises a silicon (Si) wafer, but it may also include a germanium (Ge) wafer. After the front-end CMOS process, device structures including transistors and isolation regions are formed on a surface of the CMOS-compatible wafer. No major interconnection between the devices on the CMOS-compatible wafer are formed at this stage. A handle wafer is attached to a top side of the CMOS-compatible wafer (i.e. the side of the CMOS-compatible wafer where the device structures are formed) before the CMOS-compatible wafer is etched on a bottom side (i.e. the side of the wafer substrate) to form the partially processed CMOS device layer 204. In the present embodiment, the partially processed CMOS device layer 204 is etched to a thickness of less than 1 µm, and preferably to about 800 nm. The handle wafer therefore provides mechanical support for the relatively thin partially processed CMOS device layer 204. The processes involved in etching the partially processed CMOS device layer 204 are not detailed here for succinctness but the relevant processes are discussed in U.S. Pat. No. 10,049, 947 and this is incorporated here in its entirety. The partially processed CMOS device layer 204 includes at least one transistor 205.

In a step 504, an electrically conductive interlayer 228 is formed to the device layer 210. Preferably, the electrically conductive interlayer 228 has an electrical conductivity similar to that of a metal so that a lateral resistance of the electrically conductive interlayer 228 is minimized. The electrically conductive interlayer 228 may therefore include any electrically conductive material so long as the lateral resistance of the electrically conductive interlayer 228 is within an acceptable range (e.g. less than 100 Ohm/sq) so as not to compromise a device performance of the III-V device 217, 304, 406. The electrically conductive interlayer 228 may comprise one or more layers of metals, metallic and/or conductive oxides like indium tin oxide (ITO), in any combination.

In a step 506, a bonding material 230 is deposited to the electrically conductive interlayer 228. The bonding material 230 in the present embodiment includes silicon dioxide ($SiO_2$). In other embodiments, the bonding material 230 may comprise one or more of any other suitable bonding material such as aluminum oxide ($AlO_x$) and silicon nitride ($SiN_x$). In some embodiments, the electrically conductive interlayer 228 is bonded directly to the partially processed CMOS device layer 204 without the need of the bonding material 230. In these cases, the step 506 and its subsequent step 508 are not performed.

In a step 508, the bonding material 230 is chemo-mechanically polished. This ensures that a flat surface of the bonding material 230 is achieved prior to a subsequent bonding process for enhancing an eventual bonding strength between the electrically conductive interlayer 228 and the partially processed CMOS device layer 204. In the present embodiment, prior to bonding the partially processed CMOS device layer 204 to the electrically conductive interlayer 228 via the bonding material 230, the partially processed CMOS device layer 204 is attached to a handle wafer such that the surface of the partially processed CMOS device layer 204 on which the at least one transistor 205 is formed is facing the handle wafer. In the present embodiment, the handle wafer is the same handle wafer as the one previously attached to the partially processed CMOS device layer 204 as described in the step 502 so that no additional step is required to attach the handle wafer at this stage. In an embodiment, a bonding oxide and/or nitride may also be deposited on a bottom side of the partially processed CMOS device layer 204 (i.e. an opposite side to the handle wafer with respect to the partially processed CMOS device layer 204).

In a step 510, the electrically conductive interlayer 228 is bonded to the partially processed CMOS device layer 204. In the present embodiment, the partially processed CMOS device layer 204 is bonded to the electrically conductive interlayer 228 via the bonding material 230. In an embodiment where another bonding oxide or nitride layer is deposited on the bottom side of the partially processed CMOS device layer 204 as discussed above, this another bonding oxide or nitride layer is bonded to the bonding material 230 deposited on the electrically conductive interlayer 228 so as to bond the partially processed CMOS device layer 204 to the electrically conductive interlayer 228. In the present embodiment where the partially processed CMOS device layer 204 is attached to the handle substrate prior to this bonding step 510, the handle substrate is removed after this bonding step 510. In some embodiments as described above, the electrically conductive interlayer 228 is bonded directly to the partially processed CMOS device layer 204.

In a step 512, vias and metal lines/interconnects are formed to electrically connect the at least one transistor 205 of the partially processed CMOS device layer 204 to the III-V device 217, 304, 406. In the present embodiments as shown in FIGS. 2 to 4, contact plugs 232 (e.g. tungsten plugs) are formed on the III-V device contacts such that a top surface of the contact plugs 232 are approximately co-planar with the at least one transistor 205 formed on the partially processed CMOS device layer 204. Following this, a back-end CMOS process can commence to form interconnects between the at least one transistor 205 of the partially processed CMOS device layer 204 and the III-V devices 217, 304, 406 to form an integrated circuit. For example, the interconnects can be formed on contact pads of the at least one transistor 205 and the contact plugs 232 of the III-V devices to connect these devices. Multiple levels of metals may be used to form a complex network of the interconnects for connecting the III-V devices and the at least one transistor of the CMOS device layer 204.

The process flow splits here for the semiconductor devices as shown in FIGS. 2 to 4. The following steps 514 and 516 are directed to embodiments where the III-V device 304, 406 is an optoelectronic device. For the embodiment of FIG. 2, the steps 514 and 516 need not be performed.

In the step 514, the substrate layer 208 is removed. The step 514 is performed after the CMOS device layer 204 is bonded to the electrically conductive interlayer 228 in the step 510. For the embodiments of FIGS. 3 and 4, the present step 514 is performed for removing the substrate layer 208 to allow light 312, 408 to be transmitted and/or received from the bottom side 314, 410 of the semiconductor device 302, 402. Prior to the step 514, a top side 316, 412 of the semiconductor device 302, 402 is attached to a support wafer or structure (not shown) to provide additional structural support given that the substrate layer 208 is removed in these embodiments. The back-end interconnects/pads can be accessed through the support wafer or structure at the top side 316, 412 of the semiconductor device 302, 402, while light is emitted or received from the bottom side 314, 410 of the semiconductor device 302, 402.

The process flow for the semiconductor device 302 as shown in FIG. 3 ends at step 514 where the substrate layer 208 is removed. For the embodiment of FIG. 4, there is an additional process step to bond the light transmissible substrate 404 to the bottom device surface 405 of the III-V device 406.

In the step 516, the light transmissible substrate 404 is bonded to the bottom device surface 405 of the III-V device 406 after the substrate layer 208 is removed in the step 514, the bottom device surface 405 being a surface previously attached to the substrate layer 208. The light transmissible substrate 404 is an optically transparent substrate and may include a glass substrate. In the embodiment as shown in FIG. 4, the bottom device surface 405 is previously attached to the substrate layer 208, via the buffer layer 212. In this case, the transmissible substrate 404 is bonded to the bottom device surface 405 of the III-V device 406, via the buffer layer 212. In an embodiment where the semiconductor device 402 does not include the buffer layer 212, the bottom device surface 405 is directly attached to the substrate layer 208. In this case, the light transmissible substrate 404 is bonded to the bottom device surface 405 of the III-V device 406 directly. In either case, it can be said that the light transmissible substrate 404 is bonded to the bottom device surface 405, and that the bottom device surface 405 is a surface previously attached to the substrate layer 208. Optionally, a bonding material such as a bonding oxide or a bonding nitride or a combination of the two can be formed to a bottom side of the III-V device 406 prior to the step 516 to aid in this bonding process step. In an embodiment, another bonding material can also be formed on a surface of the light transmissible substrate 404 prior to the step 516 to enhance a bonding strength of the light transmissible substrate 404 to the bottom device surface 405 of the III-V device 406. In this case, the light transmissible substrate 404 is bonded to the bottom device surface 405 of the III-V device 406, via the bonding material formed on the bottom side of the III-V device 406 and the another bonding material formed on the surface of the light transmissible substrate 404. After performing the step 516, the support wafer or structure attached to the top side 410 of the semiconductor device 412 may be optionally removed since the light transmissible substrate 404 provides sufficient structural support to the semiconductor device 402.

Figure 6:
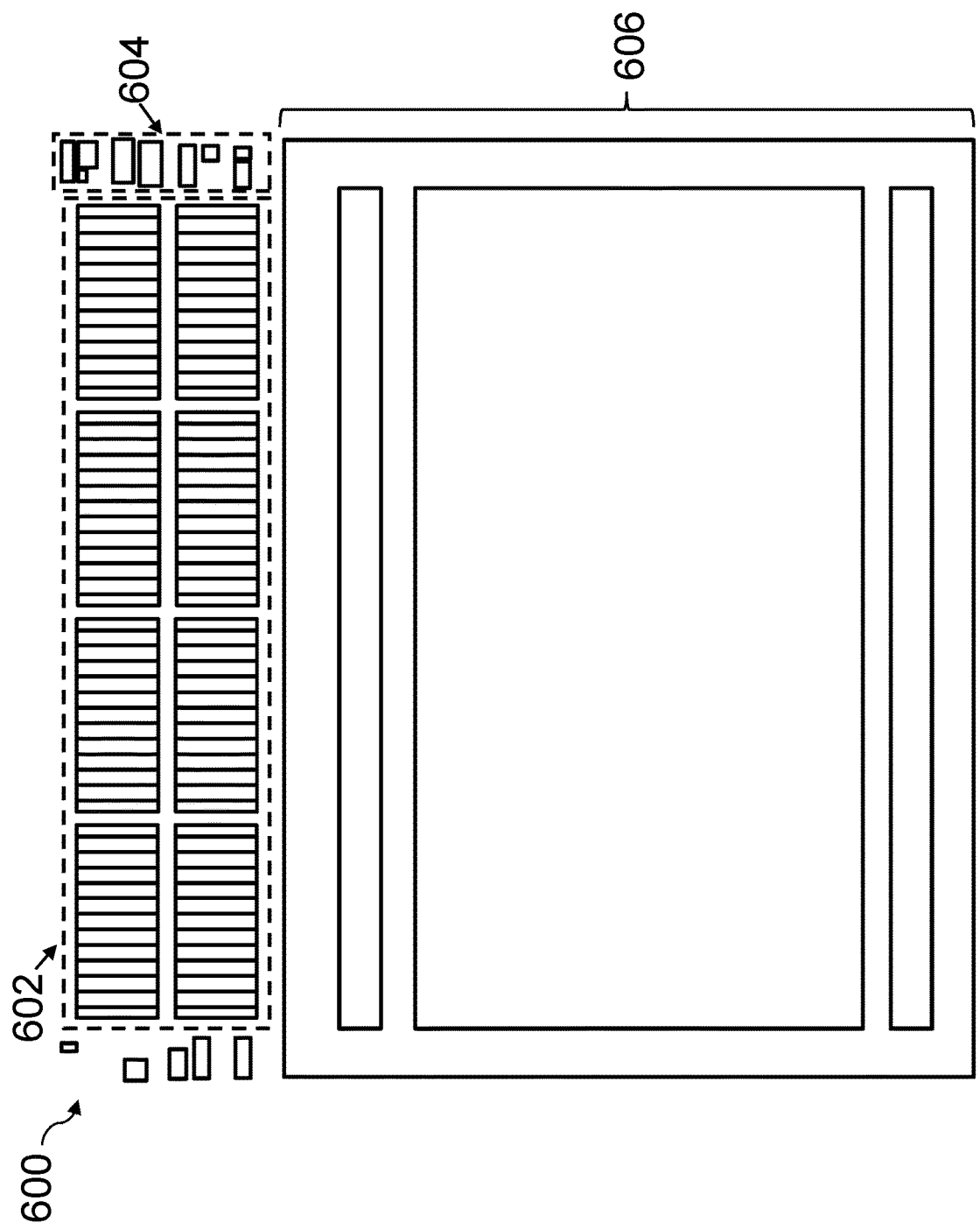
FIG. 6 shows a top plan-view of a circuit layout according to the side-by-side configuration used in the prior art of FIG. 1.
Figure 7:
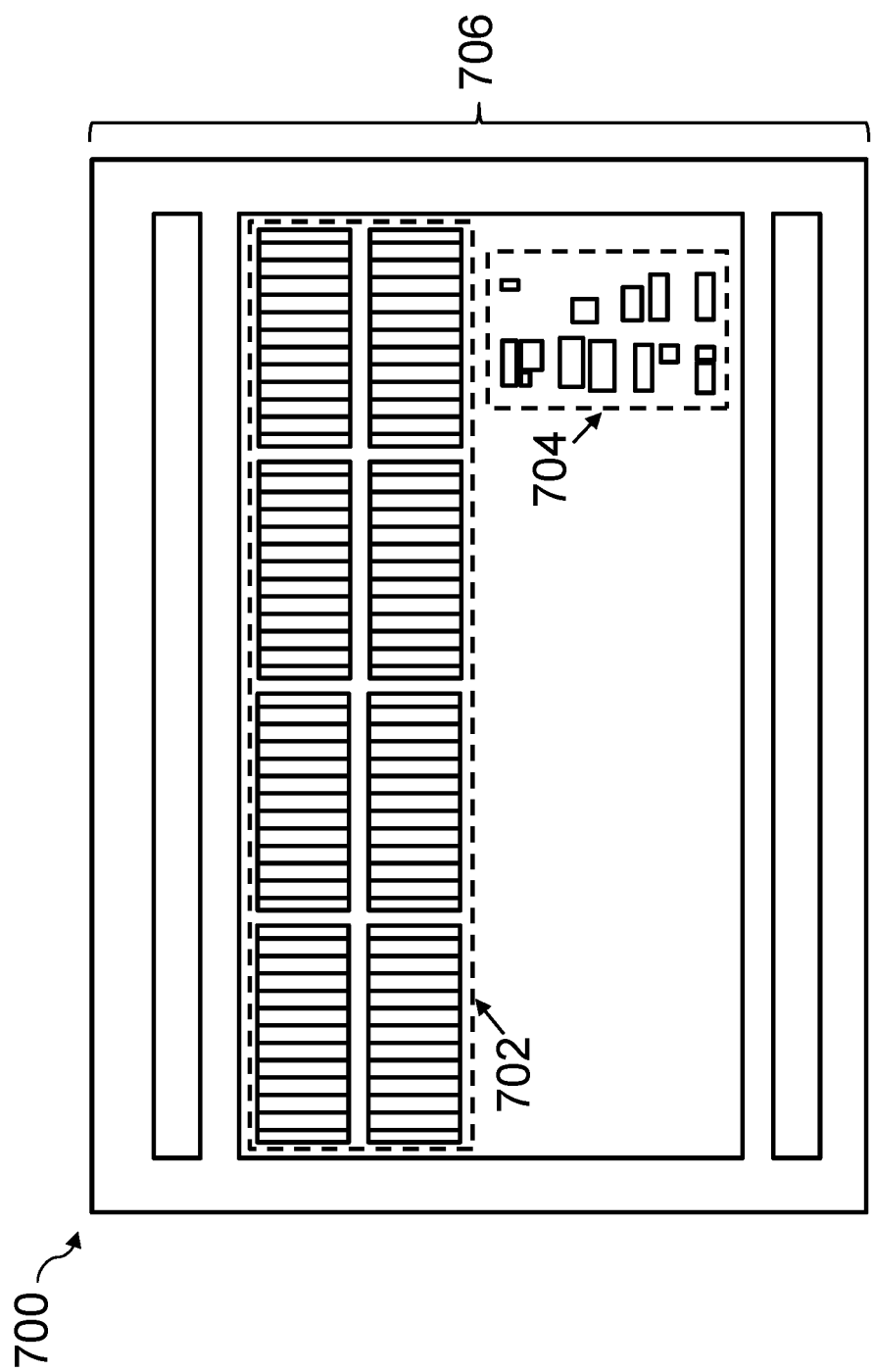
FIG. 7 shows a top plan-view of a circuit layout according to an embodiment which incorporates configurations of the semiconductor devices of FIGS. 2 to 4.

FIGS. 6 and 7 demonstrate how a size of a pixel footprint can be reduced by an implementation of the present disclosure, for example, by using the embodiments as shown in FIG. 3 or 4.

FIG. 6 shows a top plan-view of a circuit layout 600 according to the side-by-side configuration used in the prior art of FIG. 1. In this prior art configuration, CMOS drivers 602 and CMOS control circuitry 604 cannot be placed on top of the pixel as the side-by-side configuration is adopted. In this case, the LED CMOS control circuitry 604 and drivers 602 are placed adjacent to the LED active area 606, creating a total pixel footprint of about 100 μm×100 μm.

FIG. 7 shows a top plan-view of a circuit layout 700 using the embodiments as shown in FIG. 3 or 4 which incorporates an electrically conductive interlayer 228 between the partially processed CMOS device layer 204 and the device layer of the III-V semiconductor material layer. In this embodiment, the III-V device 304, 406 is an optoelectronic device such as a LED, and the pixel 706 contains the CMOS drivers 702, the CMOS control circuitry 704 and the LED active area. As shown in FIG. 7, the CMOS control circuitry 704 in the present embodiment can be placed on top of the LED pixel area 706, thereby decreasing the total pixel area to about 100 um×70 um and decreasing the pixel foot-print by about 30%. As is appreciated by the skilled person in the art, the circuit layout 700 as shown in FIG. 7 serves as one embodiment. In another embodiment, the area occupied by the CMOS drivers and the CMOS control circuitry may be similar in size to the active area of the III-V device. In this case, a reduction of the pixel foot-print of close to 50% may be achievable.

Figure 8:
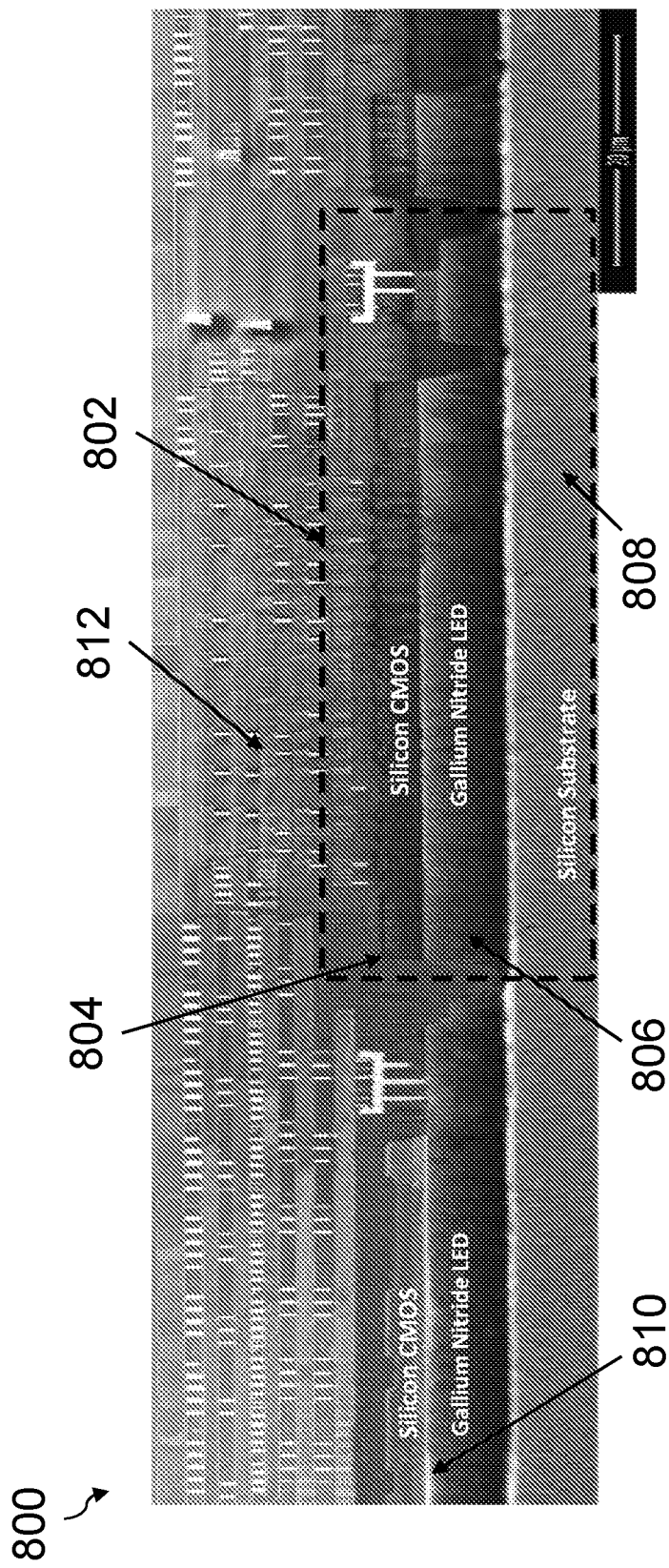
FIG. 8 shows a cross-sectional electronic microscopy (EM) image of an actual semiconductor device fabricated, the actual semiconductor device having a similar structure as shown in FIG. 2.

FIG. 8 shows a cross-sectional electronic microscopy (EM) image of an actual semiconductor device fabricated, the actual semiconductor device having a similar structure as shown in FIG. 2. As shown in FIG. 8, the integrated semiconductor device 802 comprises a CMOS device layer 804, a III-V device layer 806 and a substrate layer 808. In this example, the CMOS device layer 804 is a silicon CMOS device layer, the III-V device layer 806 is a GaN-based layer comprising a GaN LED, and the substrate layer 808 comprises a silicon substrate. The layer 810 represented by a bright line located in-between the silicon CMOS device layer 804 and the III-V device layer 806 is an electrically conductive interlayer 810. In addition, as shown in FIG. 8, circuit interconnects 812 are formed on the integrated semiconductor device 802 for connecting the silicon CMOS devices of the silicon CMOS device layer 804 with the GaN LED of the III-V device layer 806. Particularly, FIG. 8 illustrates a placement of the silicon CMOS device layer 804 being placed on top of the GaN LED device so as to achieve the reduced pixel footprint as shown in FIG. 7.

Alternative embodiments of the invention include: (i) a portion of an area (e.g. half of the area) of the III-V device being covered by the partially processed CMOS device layer, while the remaining area of the III-V device being uncovered, and (ii) all contacts (i.e. a source contact, a drain contact and/or a gate contact) of the III-V device may be formed on the top device surface 224.

For (i) above, although the density of a III-V+CMOS device circuit may not be maximized as compared to an embodiment where the III-V device is located below the partially processed CMOS device layer (e.g. as shown by the embodiment of FIGS. 2, 3 and 4), the density is still enhanced while light extraction is still possible from the top device surface 224. This trade-off may be reasonable for certain applications.

Although only certain embodiments of the present invention have been described in detail, many variations are possible in accordance with the appended claims. For example, it will be appreciated that certain process steps, like the step 508, are optional. Further, features described in relation to one embodiment may be incorporated into one or more other embodiments and vice versa.

The invention claimed is:

1. A method of fabricating a semiconductor device, comprising:
(i) forming a III-V semiconductor material layer comprising a substrate layer and a device layer attached to the substrate layer, the device layer having a III-V device comprising a top device electrode layer and a bottom device electrode layer and an active layer formed between the top device electrode layer and the bottom device electrode layer;
(ii) forming an electrically conductive interlayer on the device layer;
(iii) bonding the electrically conductive interlayer to a bottom side of a partially processed CMOS device layer having at least one transistor formed at a top side of the partially processed CMOS device layer; and
(iv) forming a contact plug on each of the top device electrode layer and the bottom device electrode layer of the III-V device, wherein a top surface of each of the contact plugs is approximately co-planar with the at least one transistor, and performing a back-end CMOS process to interconnect the at least one transistor and the III-V device to form an integrated circuit.

2. The method according to claim 1, wherein the forming the III-V semiconductor material layer includes epitaxially depositing the device layer on the substrate layer.

3. The method according to claim 1, wherein the III-V device includes an optoelectronic device having a top device surface, a bottom device surface and an active optical area between the top device and bottom device surfaces; the bottom device surface being attached to the substrate layer and passage of light is via the bottom device surface.

4. The method according to claim 3, wherein the substrate layer includes a light transmissible substrate.

5. The method according to claim 3, further comprising removing the substrate layer after the partially processed CMOS device layer is bonded to the electrically conductive interlayer.

6. The method according to claim 5, further comprising bonding a light transmissible substrate to the bottom device surface of the optoelectronic device after removal of the substrate layer.

7. The method according to claim 3, further comprising forming vias and metal lines in the back-end CMOS process to electrically connect the at least one transistor of the partially processed CMOS device layer to the optoelectronic device.

8. The method according to claim 1, further comprising depositing a bonding material on the electrically conductive interlayer prior to bonding the partially processed CMOS device layer to the electrically conductive interlayer, and the method further comprises chemo-mechanically polishing the bonding material.

9. The method according to claim 1, wherein the electrically conductive interlayer includes indium tin oxide.

10. A semiconductor device, comprising
a partially processed CMOS device layer having at least one transistor formed at a top side of the partially processed CMOS device layer;
a III-V semiconductor material layer comprising a substrate layer and a device layer attached to the substrate layer, the device layer having a III-V device, the III-V device comprises a top device electrode layer and a bottom device electrode layer and an active layer formed between the top device electrode layer and the bottom device electrode layer; and
an electrically conductive interlayer attached to a bottom side of the partially processed CMOS device layer and sandwiched between the partially processed CMOS device layer and the device layer,
wherein a contact plug is formed on each of the top device electrode layer and the bottom device electrode layer of the III-V device, a top surface of each of the contact plugs being approximately co-planar with the at least one transistor, wherein the at least one transistor is interconnected to the III-V device by a back-end CMOS process to form an integrated circuit.

11. The semiconductor device according to claim 10, wherein the III-V device includes an optoelectronic device having a top device surface, a bottom device surface, and an active optical area between the top device and bottom device surfaces, the bottom device surface being attached to the substrate layer and passage of light is via the bottom device surface.

12. The semiconductor device according to claim 11, wherein the substrate layer includes a light transmissible substrate.

* * * * *